(12) United States Patent
Sato et al.

(10) Patent No.: US 11,007,578 B2
(45) Date of Patent: May 18, 2021

(54) SURFACE-COATED CUTTING TOOL

(71) Applicant: MITSUBISHI MATERIALS CORPORATION, Tokyo (JP)

(72) Inventors: Shun Sato, Naka (JP); Tsuyoshi Ogami, Naka (JP); Kenji Yamaguchi, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 91 days.

(21) Appl. No.: 16/331,040

(22) PCT Filed: Sep. 11, 2017

(86) PCT No.: PCT/JP2017/032635
§ 371 (c)(1),
(2) Date: Mar. 6, 2019

(87) PCT Pub. No.: WO2018/051939
PCT Pub. Date: Mar. 22, 2018

(65) Prior Publication Data
US 2019/0232381 A1     Aug. 1, 2019

(30) Foreign Application Priority Data

Sep. 16, 2016    (JP) .............................. JP2016-181280

(51) Int. Cl.
*B23B 27/14*    (2006.01)
*B23B 51/00*    (2006.01)
(Continued)

(52) U.S. Cl.
CPC .............. *B23B 27/14* (2013.01); *B23B 51/00* (2013.01); *B23C 5/16* (2013.01); *C23C 14/06* (2013.01);
(Continued)

(58) Field of Classification Search
CPC . B23B 27/14; B23B 2224/24; B23B 2224/32; B23B 2226/125; B23B 2228/105
(Continued)

(56) References Cited

U.S. PATENT DOCUMENTS

2005/0013995 A1    1/2005 Ruppi
2015/0050489 A1    2/2015 Kumar et al.
(Continued)

FOREIGN PATENT DOCUMENTS

CN    1570202 A    1/2005
CN    101698933 A    4/2010
(Continued)

OTHER PUBLICATIONS

Chinese Office Action dated Mar. 26, 2020 for the corresponding Chinese Patent Application No. 201780053725.9.
(Continued)

*Primary Examiner* — Archene A Turner
(74) *Attorney, Agent, or Firm* — Leason Ellis LLP

(57) ABSTRACT

A surface-coated cutting tool comprises a hard coating layer that includes a TiAlN layer and is provided on a surface of a cutting tool body. In case the composition of the TiAlN layer is expressed by a formula: $(Ti_xAl_{1-x})N$, $0.10 \leq x \leq 0.35$ (here, x is in atomic ratio) is satisfied. In the TiAlN layer, a high Ti band-like region is present in a direction at 30 degrees or less with respect to a line normal to the surface of the cutting tool body. An average composition X of the Ti component in the high Ti band-like region satisfies $(x+0.01) \leq X \leq (x+0.05)$, an average width W of the high Ti band-like region is 30 to 500 nm, and an average area ratio St of the high Ti band-like region is 3 to 50 area %.

4 Claims, 2 Drawing Sheets

(51) Int. Cl.
    *C23C 14/06*    (2006.01)
    *B23C 5/16*     (2006.01)
    *C23C 14/32*    (2006.01)
    *B23F 21/10*    (2006.01)
    *B23F 21/16*    (2006.01)

(52) U.S. Cl.
    CPC ........ *C23C 14/0641* (2013.01); *C23C 14/325* (2013.01); *B23B 2224/24* (2013.01); *B23B 2224/32* (2013.01); *B23B 2226/125* (2013.01); *B23B 2228/105* (2013.01); *B23B 2228/24* (2013.01); *B23F 21/10* (2013.01); *B23F 21/16* (2013.01)

(58) Field of Classification Search
    USPC ........... 51/307, 309; 428/336, 472, 697, 699
    See application file for complete search history.

(56) References Cited

U.S. PATENT DOCUMENTS

| | | |
|---|---|---|
| 2015/0050490 A1 | 2/2015 | Kumar et al. |
| 2017/0113285 A1 | 4/2017 | Tatsuoka et al. |
| 2017/0021429 A1 | 6/2017 | Paseuth et al. |
| 2017/0297117 A1 | 10/2017 | Tatsuoka et al. |

FOREIGN PATENT DOCUMENTS

| | | | |
|---|---|---|---|
| CN | 101952482 A | | 1/2011 |
| CN | 103173761 A | | 6/2013 |
| CN | 103447600 A | | 12/2013 |
| CN | 103801718 A | | 5/2014 |
| CN | 104145041 A | | 11/2014 |
| JP | 2003-211304 A | | 7/2003 |
| JP | 2014-133267 A | | 7/2014 |
| JP | 2015-036189 A | | 2/2015 |
| JP | 2015-160259 | * | 9/2015 |
| JP | 2015-193071 A | | 11/2015 |
| JP | 2016-064485 A | | 4/2016 |
| JP | 2016-130343 A | | 7/2016 |
| JP | 2017-064845 A | | 4/2017 |
| WO | 2016-190332 | * | 12/2016 |

OTHER PUBLICATIONS

Extended European Search Report dated Mar. 17, 2020 for the corresponding European Patent Application No. 17850841.2.
International Search Report dated Dec. 12, 2017 for the corresponding PCT International Patent Application No. PCT/JP2017/032635.

* cited by examiner

SURFACE-COATED CUTTING TOOL

CROSS-REFERENCE TO RELATED PATENT APPLICATIONS

This application is a U.S. National Phase Application under 35 U.S.C. § 371 of International Patent Application No. PCT/JP2017/032635, filed Sep. 11, 2017, and claims the benefit of Japanese Patent Application No. 2016-181280, filed Sep. 16, 2016, all of which are incorporated herein by reference in their entireties. The International Application was published in Japanese on Mar. 22, 2018 as International Publication No. WO/2018/051939 under PCT Article 21(2).

FIELD OF THE INVENTION

The invention relates to a surface-coated cutting tool (hereinafter, referred to as coated tool), in which a hard coating layer exhibits excellent chipping resistance and wear resistance during intermittent cutting work of alloy steel or the like and exhibits excellent cutting performance for a long-term usage.

BACKGROUND OF THE INVENTION

In general, as coated tools, throw-away tips which are detachably attached to the tip end portion of an insert holder to be used for turning or planing a work material such as various kinds of steel and cast iron, drills or miniature drills used for drilling or the like of the work material, end mills used for facing, grooving, shoulder milling, and the like of the work material, solid hobs and pinion cutters used for gear cutting of the work material into tooth shapes, and the like are known.

In addition, various suggestions have hitherto been made for the purpose of improving the cutting performance of coated tools.

For example, as described in Japanese Unexamined Publication No. 2015-36189, a wear-resistant coated tool having high hardness and low residual stress is suggested in which the coated tool includes a coating including a refractory layer deposited on the surface of a cutting tool body by physical vapor deposition, the refractory layer is $M_{1-x}Al_xN$ (in the formula, x≥0.68, and M is Ti, Cr, or Zr), and the refractory layer includes a cubic crystal phase and has a hardness of about 25 GPa.

In addition, Japanese Unexamined Publication No. 2003-211304 suggests a coated tool having excellent wear resistance, in which the surface of a cutting tool body is coated with a hard coating layer formed of a TiAlN layer, the hard coating layer has a structure in which an Al highest content point (Ti lowest content point) and an Al lowest content point (Ti highest content point) are alternately repeated at Al highest inclusion point (Ti lowest inclusion point) and Al lowest inclusion point (Ti highest inclusion point) are alternately present repetitively with predetermined intervals therebetween along the layer thickness direction and the Al (Ti) content continuously changes from the Al highest content point to the Al lowest content point and from the Al lowest content point to the Al highest content point, the Al highest content point and the Al lowest content point respectively satisfy the composition formula: $(Ti_{1-X}Al_X)N$ (here, X is 0.70 to 0.95 in terms of atomic ratio) and the composition formula: $(Ti_{1-Y}Al_Y)N$ (here, Y is 0.40 to 0.65), and the interval between the Al highest content point and the Al lowest content point adjacent to each other is 0.01 to 0.1 µm.

Technical Problem

An improvement in performance of a cutting apparatus in recent years has been remarkable, and there has been a strong demand for power saving and energy saving during cutting work and a further reduction in cost. In accordance with this, there is a trend toward a further increase in speed and efficiency during cutting work. There is no particular problem in a case where the coated tool of the related art is used for cutting work of steel, cast iron, or the like under typical cutting conditions. However, in a case where this is used for cutting work during which high-temperature heat is generated and high impact and intermittent loads are exerted on a cutting edge, such as intermittent cutting work of alloy steel or the like, the initiation and propagation of cracks cannot be suppressed, and furthermore, wear progression is promoted. Therefore, in the current situation, the end of the service life is reached within a relatively short period of time.

For example, in the coated tool of the related art described in Japanese Unexamined Publication No. 2015-36189, a TiAlN layer which is a form of $M_{1-x}Al_xN$ is a layer having high hardness and excellent wear resistance and is improved in wear resistance as the Al content increases. However, lattice strain also increases, and there is a problem that chipping resistance decreases.

In addition, in the coated tool of the related art described in Japanese Unexamined Publication No. 2003-211304, by forming a compositional variation in the layer thickness direction, it is possible to cause high-temperature hardness, heat resistance, and toughness to be compatible with each other. However, due to the anisotropy in the layer, there is a problem that the initiation and propagation of cracks in a direction perpendicular to the layer thickness cannot be sufficiently prevented.

SUMMARY OF THE INVENTION

Solution to Problem

Therefore, from the above-described viewpoints, the inventors intensively conducted researches to develop a coated tool in which a hard coating layer can achieve both excellent chipping resistance and wear resistance under cutting work conditions under which high-temperature heat is generated and high impact and intermittent loads are exerted on a cutting edge, such as intermittent cutting work of alloy steel or the like, while focusing on the component composition, crystal structure, layer structure, and the like of the hard coating layer. As a result, the following knowledge was obtained.

That is, the inventors found that in a coated tool in which a hard coating layer formed of a complex nitride of Ti and Al (hereinafter, sometimes referred to as "TiAlN") is formed on the surface of a cutting tool body, the wear resistance of the entire hard coating layer is secured by causing the compositional ratio of Al to the total amount of Ti and Al to be relatively high in the layer, a problem of the occurrence of peeling caused by the hard coating layer having anisotropy as described in Japanese Unexamined Publication No. 2003-211304 is solved by forming a band-like region in which the composition of a Ti component is relatively high (hereinafter, sometimes referred to as "high Ti band-like region") at least in a direction at an angle of 30 degrees or less with respect to a line normal to the surface of the cutting tool body in the layer, the initiation and propagation of cracks in the hard coating layer is suppressed by absorbing and relieving impact and intermittent loads during cutting work by the high Ti band-like region having toughness, whereby the occurrence of chipping caused by these can be suppressed.

Therefore, the coated tool of the present invention can achieve both excellent chipping resistance and wear resistance under cutting work conditions under which high-temperature heat is generated and high impact and intermittent loads are exerted on a cutting edge.

The invention is made based on the above-described knowledge and is characterized by including "(1) A surface-coated cutting tool in which a hard coating layer is provided on a surface of a cutting tool body made of any of WC-based cemented carbide, TiCN-based cermet, or a cubic boron nitride-based sintered material, the hard coating layer including at least a complex nitride layer of Ti and Al with an average layer thickness of 0.5 to 10.0 μm, in which, in a case where a composition of the complex nitride layer of Ti and Al is expressed by a composition formula: $(Ti_xAl_{1-x})N$, the complex nitride layer of Ti and Al has an average composition satisfying $0.10 \leq x \leq 0.35$ (here, x is in atomic ratio), and in the complex nitride layer of Ti and Al, a band-like region in which a composition of a Ti component is relatively high compared to an average composition x of the Ti component is present at least in a direction at an angle of 30 degrees or less with respect to a line normal to the surface of the cutting tool body.

(2) The surface-coated cutting tool according to (1), in which, in a case where the average composition of the Ti component in the band-like region in which the composition of the Ti component is relatively high is referred to as X, the average composition x of the Ti component in the complex nitride layer of Ti and Al and the X satisfy a relationship of $(x+0.01) \leq X \leq (x+0.05)$.

(3) The surface-coated cutting tool according to (1) or (2), in which an average width W of the band-like region in which the composition of the Ti component is relatively high is 30 to 500 nm.

(4) The surface-coated cutting tool according to any one of (1) to (3), in which an average area ratio St of the band-like region in which the composition of the Ti component is relatively high to a longitudinal section of the complex nitride layer of Ti and Al is 3 to 50 area %.

(5) The surface-coated cutting tool according to any one of (1) to (4), in which the complex nitride layer of Ti and Al has a mixed structure of crystal grains having a cubic structure and crystal grains having a hexagonal structure, and an average area ratio S of the crystal grains having a cubic structure to a longitudinal section of the complex nitride layer of Ti and Al is 30 area % or more."

Next, a coated tool of the invention will be described in detail.

Average Layer Thickness of TiAlN Layer:

A hard coating layer includes at least a TiAlN layer. However, when the average layer thickness of the TiAlN layer is less than 0.5 μm, the wear resistance improving effect imparted by the TiAlN layer cannot be sufficiently obtained, whereas when the average layer thickness thereof exceeds 10.0 μm, strain in the TiAlN layer becomes large and self-destruction easily occurs, so that the average layer thickness of the TiAlN layer is set to 0.5 to 10.0 μm.

Average Composition of TiAlN Layer:

In a case where the TiAlN layer is expressed by a composition formula: $(Ti_xAl_{1-x})N$, the TiAlN layer needs to have an average composition satisfying $0.10 \leq x \leq 0.35$ (here, x is in atomic ratio).

In a case where x representing the average composition of the average composition of the Ti component is less than 0.10, TiAlN crystal grains having a hexagonal structure are likely to be formed, and the hardness of the TiAlN layer decreases, so that sufficient wear resistance cannot be obtained.

On the other hand, in a case where x representing the average composition of the Ti component exceeds 0.35, the compositional ratio of an Al component decreases, so that the high-temperature hardness and high-temperature oxidation resistance of the TiAlN layer decrease.

Therefore, the average composition x of the Ti component is set to $0.10 \leq x \leq 0.35$.

The atomic ratios of the content ratios of Ti, Al, and N are quantified except for element such as carbon and oxygen, which are unavoidably detected due to the effect of contamination of the surface of a cutting tool body and the like. When the content ratio of N to the sum of the atomic ratios of the content ratios of Ti, Al, and N is in a range of 0.45 to 0.65, the same effect can be obtained in the TiAlN layer of the present invention, and there is no particular problem.

Average Area Ratio S of Crystal Grains Having Cubic Structure in TiAlN Layer:

In the TiAlN layer of the present invention, since the average compositional ratio of the Al component is set to as high as 0.65 to 0.90 (here, atomic ratio), the TiAlN layer has a mixed structure of crystal grains having a cubic structure and crystal grains having a hexagonal structure. However, the average area ratio S (area %) of the crystal grains having a cubic structure to a longitudinal section of the TiAlN layer is preferably set to 30 area % or more.

This is because when the average area ratio S of the crystal grains having a cubic structure is less than 30 area %, the area ratio of the crystal grains having a hexagonal structure relatively increases, the hardness of the TiAlN layer decreases, and as a result, the wear resistance decreases.

The average area ratio S of the crystal grains having a cubic structure can be obtained by measuring a section of the TiAlN layer in a direction perpendicular to the surface of the cutting tool body, for example, using a field emission scanning electron microscope and an electron backscatter diffraction apparatus.

High Ti Band-Like Region:

As shown in the schematic view of FIG. 1, in the present invention, a high Ti band-like region in which the average composition X of the Ti component is relatively high compared to the average composition x of the Ti component is formed in the TiAlN layer in a direction at an angle of 30 degrees of less with respect to a line normal to the surface of the cutting tool body.

Since the direction in which the high Ti band-like region is formed is set to a direction at an angle of 30 degrees of less with respect to the line normal to the surface of the cutting tool body, anisotropy in the layer thickness direction, which is likely to occur in the coated tool described in Japanese Unexamined Publication No. 2003-211304, is absent, so that peeling of the TiAlN layer does not occur. Furthermore, due to the presence of the high Ti band-like region, the toughness is improved. Therefore, even when intermittent and impact loads are exerted during cutting work, the occurrence of chipping and fracturing in the TiAlN layer is suppressed.

In the high Ti band-like region, when the average composition of the Ti component of the band-like region is referred to as X, the average composition x of the Ti component in the TiAlN layer and the X preferably satisfy a relationship of $(x+0.01) \leq X \leq (x+0.05)$ (here, both x and X are in atomic ratio).

This is because when the X satisfies $X<(x+0.01)$, it cannot be said that a significant high Ti band-like region is formed in the TiAlN layer, so that a toughness improving effect and an impact absorbing and relieving effect cannot be expected, whereas in a case of $(x+0.05)<X$, the high Ti band-like region in the TiAlN layer is formed as a partial low hardness region, and the wear resistance decreases due to the occurrence of uneven wear or the like.

As shown in the schematic view of FIG. 1, in a case where the average width of the high Ti band-like region is referred to as W (nm), W is desirably 30 to 500 nm.

This is because when the W is less than 30 nm, it is difficult to confirm the presence of the high Ti band-like region, the TiAlN layer has a substantially homogeneous composition as a whole, and thus the toughness improving effect and the impact absorbing and relieving effect cannot be expected, whereas when the W exceeds 500 nm, a partial low hardness region is formed in the TiAlN layer, and the wear resistance decreases due to the occurrence of uneven wear or the like.

As will be described later, the width of the high Ti band-like region refers to the width of a Ti band-like region in which the average composition X of the Ti component in a case where the composition of the Ti component of the longitudinal section of the TiAlN layer is measured, for example, by energy-dispersive X-ray spectroscopy (EDS) using a transmission electron microscope (TEM) (hereinafter, referred to as "TEM-EDS") satisfies the above-described relationship $(x+0.01) \leq X \leq (x+0.05)$.

Average Area Ratio St of High Ti Band-Like Region:

Regarding the longitudinal section of the TiAlN layer, in a case where the width (contour) of the high Ti band-like region is specified, for example, by TEM-EDS and the average area ratio St (area %) of the high Ti band-like region is measured, the St (area %) to the longitudinal section of the TiAlN layer is preferably 3 to 50 area %.

This is because in a case where the St is less than 3 area %, the toughness improving effect and the impact absorbing and relieving effect due to the formation of the high Ti band-like region are small, and thus the degree of improvement in chipping resistance is low, whereas in a case where the St exceeds 50 area %, the high Ti band-like region is formed as a low hardness region, and as a result the wear resistance decreases due to the occurrence of uneven wear or the like.

Specification of High Ti Band-Like Region:

As shown in the schematic view of FIG. 1, in a measurement image measured by TEM-EDS in a visual field in which a band-like width of at least about 500 nm is included, by whether or not the composition of the Ti component at a plurality of measurement points on a straight line at an angle of 30 degrees of less with respect to a line normal to the surface of the body is in a range of $(x+0.01)$ to $(x+0.05)$ (here, x is the average composition of the Ti component in the entire TiAlN layer described above), whether or not the straight line is a straight line that belongs to the high Ti band-like region is determined. Next, in a case where the straight line belongs to the high Ti band-like region, the composition of the Ti component in a direction perpendicular to the straight line is measured, and a position where the measured composition of the Ti component deviates from the relationship of $(x+0.01) \leq X \leq (x+0.05)$ is specified as the boundary of the high Ti band-like region.

Next, the composition of the Ti component at a plurality of positions in the high Ti band-like region specified above is measured, and by averaging the compositions, the average composition X of the Ti component in the high Ti band-like region can be obtained.

In addition, the contour of the high Ti band-like region specified above is determined, the width at a plurality of positions is measured, and by averaging the widths, the average width W of the high Ti band-like region can be obtained.

Measurement of Crystal Structure and Area Ratio:

The TiAlN layer of the present invention has a mixed structure of crystal grains having a cubic structure and crystal grains having a hexagonal structure. The crystal structure and the area ratio thereof can be obtained by measuring a section of the TiAlN layer in a direction perpendicular to the surface of the cutting tool body, for example, using the field emission scanning electron microscope and the electron backscatter diffraction apparatus.

More specifically, in a state where the section of the TiAlN layer in the direction perpendicular to the surface of the cutting tool body is polished into a polished surface, the polished surface is set in the body tube of the field emission scanning electron microscope, and an electron beam is emitted toward each of the crystal grains present in a measurement range of the polished section, at an incident angle of 70 degrees with respect to the polished surface at an acceleration voltage of 15 kV and an emission current of 1 nA. Regarding a measurement range with a length of 100 µm in the direction parallel to the cutting tool body and a distance of equal to or less than the layer thickness along the section in the direction perpendicular to the surface of the cutting tool body, an electron backscatter diffraction image is measured at an interval of 0.01 µm/step. By analyzing the crystal structure of the individual crystal grains, the area ratio of the crystal grains having a cubic structure can be measured.

The above measurement is performed on five measurement ranges, and the average value thereof is calculated as the average area ratio S of the crystal grains having a cubic structure. In addition, regarding the measurement points at an interval of 0.01 µm/step, more specifically, equilateral triangles with a side of 0.01 µm are disposed to fill the measurement range, the apexes of each equilateral triangle are taken as the measurement points, and the measurement result at one measurement point is a measurement result representing the measurement result of the area of one equilateral triangle. Therefore, as described above, the area ratio is obtained from the ratio of the number of measurement points.

Film Forming Method of TiAlN Layer:

The TiAlN layer of the present invention having the above characteristics can be formed, for example, by the following method.

FIGS. 2A and 2B illustrate schematic views of an arc ion plating (hereinafter, referred to as "AIP") apparatus for forming the TiAlN layer of the present invention.

In the AIP apparatus illustrated in FIGS. 2A and 2B, Ti—Al alloy targets having a predetermined composition are disposed, cutting tool bodies made of any of WC-based cemented carbide, TiCN-based cermet, or a cubic boron nitride-based sintered material are placed on a rotation table of the AIP apparatus, the cutting tool bodies are subjected to a bombardment pretreatment, and an arc discharge is generated by controlling the temperature (film forming temperature) of the cutting tool bodies and the bias voltage during film formation, whereby the TiAlN layer of the present invention can be obtained.

In particular, the composition distribution of the Ti component is caused to spontaneously form by a gradual change from a process with a high bias voltage to a process with a low bias voltage, and furthermore, an atomic layer deposition relationship along a crystal alignment parallel to the direction at an angle of 30 degrees of less with respect to the line normal to the surface of the cutting tool body is controlled by controlling the temperature (film forming temperature) of the cutting tool body and the bias voltage, whereby the high Ti band-like region defined in the present invention can be formed.

Advantageous Effects of Invention

In the coated tool of the present invention, since the high Ti band-like region in which the composition of the Ti component is relatively high compared to the average composition x of the Ti component of the TiAlN layer is present in the TiAlN layer forming the hard coating layer in a direction at an angle of 30 degrees of less with respect to the line normal to the surface of the cutting tool body, the high Ti band-like region having sufficient characteristics, particularly toughness is present continuously in the layer thickness direction of the hard coating layer, so that the anisotropy of the characteristics of the entire hard coating layer is solved and the peeling resistance is improved. Furthermore, since the high Ti band-like region having toughness absorbs and relieves impact and intermittent loads during cutting work, the initiation and propagation of cracks in the hard coating layer can be suppressed, and the occurrence of chipping caused by these can be suppressed. Accordingly, even in a case where the coated tool of the present invention is provided under intermittent cutting work conditions under which high-temperature heat is generated and high impact and intermittent loads are exerted on a cutting edge, the coated tool of the present invention can achieve both excellent chipping resistance and wear resistance.

BRIEF DESCRIPTION OF THE DRAWINGS

These and other features and advantages of the present invention will become more readily appreciated when considered in connection with the following detailed description and appended drawing(s), wherein like designations denote like elements in the various views, and wherein:

FIGS. 2A and 2B illustrate an arc ion plating (AIP) apparatus used for forming the TiAlN layer of the coated tool of the present invention, in which FIG. 2A is a schematic plan view, and FIG. 2B is a schematic front view.

DETAILED DESCRIPTION OF THE INVENTION

Next, the coated tool of the invention will be described in detail with reference to examples.

In a specific description, a coated tool using WC-based cemented carbide as a cutting tool body is described. However, the same applies to a coated tool using TiCN-based cermet or a cubic boron nitride-based sintered material as a cutting tool body.

EXAMPLES

Production of Cutting Tool Body:

As raw material powders, a Co powder, a TaC powder, a NbC powder, a TiC powder, a $Cr_3C_2$ powder, and a WC powder, all of which had an average particle size of 0.5 to 5 μm, were prepared, and the raw material powders were mixed in mixing compositions shown in Table 1. Wax was further added thereto, and the mixture was subjected to wet mixing by a ball mill for 72 hours and was dried under reduced pressure. Thereafter, the resultant was press-formed at a pressure of 100 MPa, and such compacts were sintered and processed into predetermined dimensions, whereby cutting tool bodies 1 and 2 made of WC-based cemented carbide with insert shapes according to ISO standard SEEN1203AFEN were produced.

TABLE 1

| Cutting tool | Mixing composition (mass %) | | | | | |
|---|---|---|---|---|---|---|
| body type | Co | TiC | TaC | NbC | $Cr_3C_2$ | WC |
| 1 | 8.0 | 1.5 | — | 2.6 | 0.3 | Remainder |
| 2 | 8.5 | — | 1.8 | 0.3 | — | Remainder |

Figure 2A:
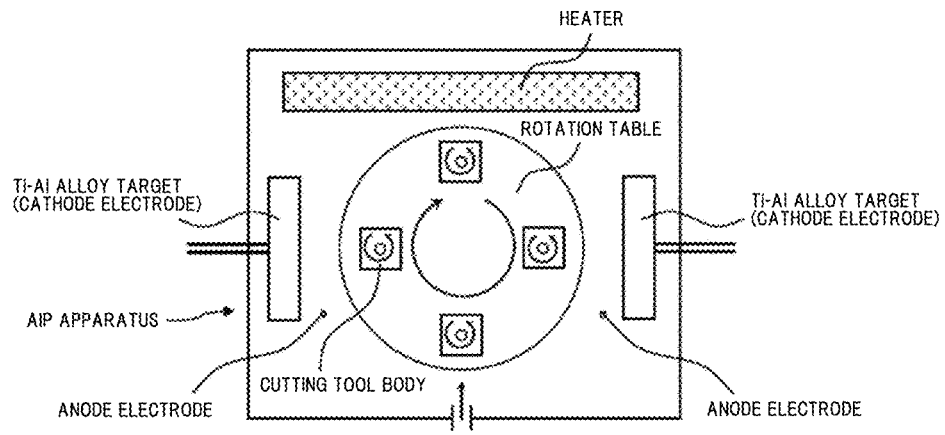
Figure 2B:
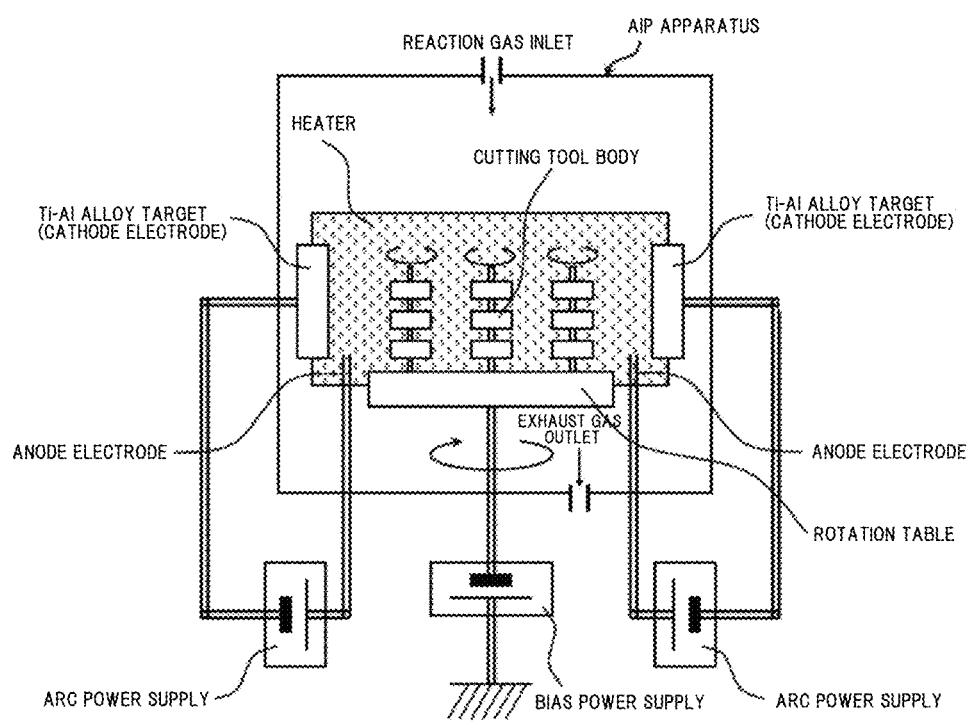

The cutting tool bodies 1 and 2 were subjected to ultrasonic cleaning in acetone and were dried, and in this state, were mounted at positions distant from the center axis on the rotation table of the AIP apparatus illustrated in FIGS. 2A and 2B by predetermined distances in the radial direction along the outer circumferential portion, and Ti—Al alloy targets (cathode electrodes) having a predetermined composition were disposed in the AIP apparatus.

First, while the inside of the apparatus was evacuated and held in a vacuum, the cutting tool bodies were heated to temperatures shown in Table 2 by a heater. Thereafter, a DC bias voltage shown in Table 2 was applied to the cutting tool bides that were rotated while revolving on the rotation table to cause an arc current shown in Table 2 to flow through the Ti—Al alloy targets (cathode electrodes) and generate an arc discharge such that the surfaces of the cutting tool bodies were subjected to bombardment cleaning.

Next, nitrogen gas as a reaction gas was introduced into the apparatus to reach a nitrogen pressure shown in Table 2, the temperatures of the cutting tool bodies which were rotated while revolving on the rotation table were maintained in a temperature range shown in Table 2, an arc current shown in Table 2 was caused to flow through the Ti—Al alloy targets (cathode electrodes) to generate an arc discharge, a low DC bias voltage shown in Table 2 was applied to the cutting tool bodies for a predetermined time shown in Table 2, the bias voltage was then sequentially boosted linearly or stepwise in a graph in which the horizontal axis is time and the vertical axis is bias (−V) to follow an increase rate shown in Table 2, a high DC bias voltage shown in Table 2 was then applied, whereby a TiAlN layer was formed. Accordingly, each of present invention coated tools 1 to 9 (hereinafter, referred to as present invention cutting tools 1 to 9) having a target average layer thickness, the average composition x of the Ti component, the average area ratio S of the crystal grains having a cubic structure, a predetermined high Ti band-like region (the average composition X of the Ti component, the average width W, and the average area ratio St) shown in Table 4 was produced.

For the purpose of comparison, a TiAlN layer was formed under bombardment conditions shown in Table 3 and film forming conditions also shown in Table 3 by using the AIP apparatus shown in FIGS. 2A and 2B, whereby each of comparative example coated tools 1 to 10 (hereinafter, comparative example cutting tools 1 to 10) shown in Table 5 was produced.

The TiAlN layers of the present invention cutting tools 1 to 9 and the comparative example cutting tools 1 to 10 were measured in a cross-section using a scanning electron microscope, and the average layer thickness was calculated from the average value of measured values at five points.

The composition of the Ti component in the TiAlN layer was measured by TEM-EDS in a visual field range of 0.4 μm or more in the film thickness direction and 1 μm or more in a direction parallel to the surface of the tool body at three points, and the average value of the measured values was obtained as the average composition x of the Ti component of the TiAlN layer.

Table 4 and Table 5 show the values.

Regarding the TiAlN layers of the present invention cutting tools 1 to 9 and the comparative example cutting tools 1 to 10, the presence or absence of the high Ti band-like region in the TiAlN layers was confirmed by TEM-EDS. In a case where the high Ti band-like region was present, the average composition X of the Ti component in the the region, the average width W of the region, and the average area ratio St of the region to the longitudinal section of the TiAlN layer were obtained.

Figure 1:
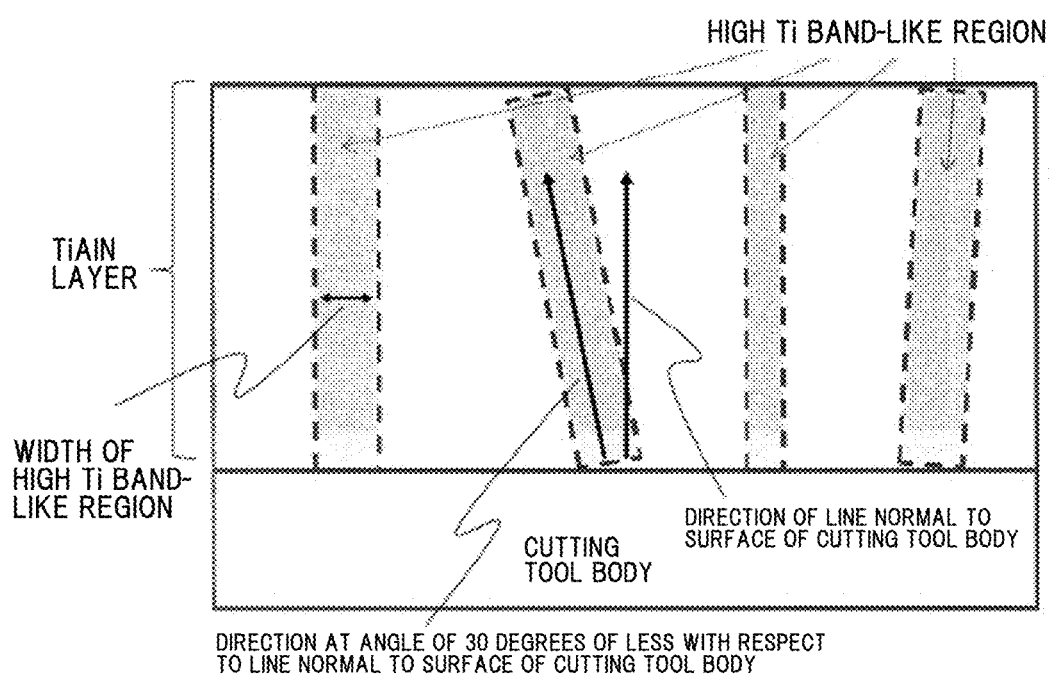
FIG. 1 illustrates a schematic longitudinal sectional view of a TiAlN layer of a coated tool of the present invention.

Specifically, regarding the longitudinal section of the TiAlN layer as shown in FIG. 1, in a measurement image measured by TEM-EDS in a visual field in which a band-like width of at least about 500 nm is included, the composition of the Ti component at a plurality of measurement points on a straight line at an angle of 30 degrees of less with respect to a line normal to the surface of the body is measured, and by whether or not the measured value is in a range of (x+0.01) to (x+0.05), whether or not the straight line is a straight line that belongs to the high Ti band-like region is determined.

Next, in a case where it is determined that the straight line is the straight line that belongs to the high Ti band-like region, the composition of the Ti component in a direction perpendicular to the straight line is measured, and a position where the measured composition of the Ti component deviates from the relationship of $(x+0.01) \leq X \leq (x+0.05)$ is specified as the boundary of the high Ti band-like region.

Next, the composition of the Ti component at a plurality of positions in the high Ti band-like region specified above is measured, and by averaging the compositions, the average composition X of the Ti component in the high Ti band-like region is obtained.

Next, the contour of the high Ti band-like region specified above is determined, the width at a plurality of positions is measured, and by averaging the widths, the average width W of the high Ti band-like region is obtained.

Furthermore, by obtaining the total area of the high Ti band-like region present in the area of the measured visual field from the obtained contour of the high Ti band-like region, the average area ratio St of the high Ti band-like region to the longitudinal section of the TiAlN layer is calculated.

Table 4 and Table 5 show the values.

In addition, regarding the TiAlN layers of the present invention cutting tools 1 to 9 and the comparative example cutting tools 1 to 10, the average area ratio S of the crystal grains having a cubic structure to the entire TiAlN layer was obtained by using the field emission scanning electron microscope and the electron backscatter diffraction apparatus.

Specifically, in a state where the section of the TiAlN layer in the direction perpendicular to the surface of the cutting tool body was polished into a polished surface, the polished surface was set in the body tube of the field emission scanning electron microscope, and an electron beam was emitted toward each of the crystal grains present in a measurement range of the polished section, at an incident angle of 70 degrees with respect to the polished surface at an acceleration voltage of 15 kV and an emission current of 1 nA. Regarding a measurement range with a length of 100 μm in the direction parallel to the cutting tool body and a distance of equal to or less than the layer thickness along the section in the direction perpendicular to the surface of the cutting tool body, an electron backscatter diffraction image was measured at an interval of 0.01 μm/step. By analyzing the crystal structure of the individual crystal grains, the area ratio of the crystal grains having a cubic structure was measured.

The above measurement was performed on five measurement ranges, and the average value thereof was calculated as the average area ratio S of the crystal grains having a cubic structure to the entire TiAlN layer.

Table 4 and Table 5 show the values.

TABLE 2

| | | | Bombardment condition | | | TiAlN layer forming condition | | |
|---|---|---|---|---|---|---|---|---|
| Type | | Cutting tool body type | Cutting tool body temperature (° C.) | DC bias voltage (−V) | Arc current (A) | Al composition of Target TiAl alloy (at %) | $N_2$ gas pressure (Pa) | Cutting tool body temperature (° C.) |
| Present invention cutting tool | 1 | 1 | 400 | 1000 | 100 | 80 | 4 | 400 |
| | 2 | 1 | 400 | 1000 | 100 | 70 | 4 | 400 |
| | 3 | 1 | 400 | 1000 | 100 | 75 | 4 | 400 |
| | 4 | 1 | 400 | 1000 | 100 | 85 | 4 | 400 |
| | 5 | 1 | 400 | 1000 | 100 | 73 | 4 | 400 |
| | 6 | 2 | 400 | 1000 | 100 | 83 | 4 | 400 |
| | 7 | 2 | 400 | 1000 | 100 | 75 | 4 | 400 |
| | 8 | 2 | 400 | 1000 | 100 | 80 | 4 | 400 |
| | 9 | 2 | 400 | 1000 | 100 | 73 | 4 | 400 |

TABLE 2-continued

| | | | TiAlN layer forming condition | | | | |
|---|---|---|---|---|---|---|---|
| | | | DC bias voltage | | | | |
| | | | Low bias voltage | | Bias | High bias | |
| Type | | | Voltage (-V) | Application time (sec) | increasing rate (-V/sec) | voltage Voltage (-V) | Arc current (A) |
| Present invention cutting tool | 1 | | 25 | 60.0 | 1.0 | 250 | 100 |
| | 2 | | 15 | 60.0 | 1.0 | 300 | 100 |
| | 3 | | 30 | 60.0 | 1.0 | 300 | 100 |
| | 4 | | 20 | 60.0 | 1.0 | 200 | 100 |
| | 5 | | 15 | 60.0 | 1.0 | 250 | 100 |
| | 6 | | 25 | 60.0 | 1.0 | 250 | 100 |
| | 7 | | 20 | 60.0 | 1.0 | 300 | 100 |
| | 8 | | 15 | 60.0 | 1.0 | 200 | 100 |
| | 9 | | 30 | 60.0 | 1.0 | 300 | 100 |

TABLE 3

| | | Bombardment condition | | | | TiAlN layer forming condition | | | | |
|---|---|---|---|---|---|---|---|---|---|---|
| Type | | Cutting tool body type | Cutting tool body temperature (° C.) | DC bias voltage (-V) | Arc current (A) | Al composition of Target TiAl alloy (at %) | N₂ gas pressure (Pa) | Cutting tool body temperature (° C.) | DC bias voltage Voltage (-V) | Arc current (A) |
| Comparative example cutting tool | 1 | 1 | 400 | 1000 | 100 | 80 | 4 | 400 | 50 | 100 |
| | 2 | 1 | 400 | 1000 | 100 | 70 | 4 | 400 | 50 | 100 |
| | 3 | 1 | 400 | 1000 | 100 | 75 | 4 | 400 | 50 | 100 |
| | 4 | 1 | 400 | 1000 | 100 | 85 | 4 | 400 | 50 | 100 |
| | 5 | 1 | 400 | 1000 | 100 | 73 | 4 | 400 | 50 | 100 |
| | 6 | 2 | 400 | 1000 | 100 | 83 | 4 | 400 | 50 | 100 |
| | 7 | 2 | 400 | 1000 | 100 | 75 | 4 | 400 | 50 | 100 |
| | 8 | 2 | 400 | 1000 | 100 | 80 | 4 | 400 | 50 | 100 |
| | 9 | 2 | 400 | 1000 | 100 | 73 | 4 | 400 | 50 | 100 |
| | 10 | 2 | 400 | 1000 | 100 | 70 | 4 | 400 | 50 | 100 |

TABLE 4

| | | TiAlN layer | | | Confirmation of presence of high Ti band-like region | | High Ti band-like region | | |
|---|---|---|---|---|---|---|---|---|---|
| Type | | Average composition x of Ti (atomic ratio) | Average area ratio S of crystal grains having cubic structure (area %) | Target average layer thickness (μm) | Presence or absence of band-like region | Angle with respect to line normal to surface of cutting tool body (°) | Average composition X of Ti of high Ti band-like region (atomic ratio) | Average width W of high Ti band-like region (nm) | Average area ratio St of high Ti band-like region (area %) |
| Present invention cutting tool | 1 | 0.2 | 35 | 5 | Present | 10 | 0.24 | 100 | 25.0 |
| | 2 | 0.32 | 95 | 4 | Present | 28 | 0.36 | 450 | 35.0 |
| | 3 | 0.25 | 43 | 4.5 | Present | 15 | 0.28 | 35 | 15.0 |
| | 4 | 0.16 | 25 | 3 | Present | 5 | 0.2 | 150 | 40.0 |
| | 5 | 0.28 | 65 | 6 | Present | 21 | 0.31 | 250 | 32.0 |
| | 6 | 0.22 | 32 | 3.5 | Present | 8 | 0.24 | 65 | 22.0 |
| | 7 | 0.26 | 39 | 5 | Present | 15 | 0.29 | 180 | 38.0 |
| | 8 | 0.18 | 33 | 1 | Present | 18 | 0.21 | 300 | 4.0 |
| | 9 | 0.29 | 55 | 9 | Present | 7 | 0.32 | 120 | 12.0 |

TABLE 5

| Type | | Average composition x of Ti (atomic ratio) | Average area ratio S of crystal grains having cubic structure (area %) | Target average layer thickness (μm) | Confirmation of presence of high Ti band-like region | | High Ti band-like region | | |
|---|---|---|---|---|---|---|---|---|---|
| | | | | | Presence or absence of band-like region | Angle with respect to line normal to surface of cutting tool body (°) | Average composition X of Ti of high Ti band-like region (atomic ratio) | Average width W of high Ti band-like region (nm) | Average area ratio St of high Ti band-like region (area %) |
| Comparative example cutting tool | 1 | 0.21 | 15 | 4 | — | — | — | — | — |
| | 2 | 0.33 | 97 | 7 | — | — | — | — | — |
| | 3 | 0.27 | 18 | 5 | — | — | — | — | — |
| | 4 | 0.18 | 0 | 6 | — | — | — | — | — |
| | 5 | 0.29 | 22 | 2 | — | — | — | — | — |
| | 6 | 0.2 | 3 | 8 | — | — | — | — | — |
| | 7 | 0.28 | 8 | 1 | — | — | — | — | — |
| | 8 | 0.23 | 4 | 7 | — | — | — | — | — |
| | 9 | 0.31 | 65 | 2 | — | — | — | — | — |
| | 10 | 0.33 | 98 | 4 | — | — | — | — | — |

Next, the present invention cutting tools 1 to 9 and the comparative example cutting tools 1 to 10 were subjected to dry high-speed face milling, which is a type of high-speed intermittent cutting, and a center-cut cutting test under the following conditions, and the flank wear width of a cutting edge was measured.

Cutting test: dry high-speed face milling, center-cut cutting work
Cutter diameter: 125 mm
Work material: a JIS SCM445 block material with a width of 100 mm and a length of 365 mm
Cutting speed: 360 m/min
Depth of cut: 2.0 mm
Feed per tooth: 0.2 mm/tooth
Cutting time: 8 minutes.
Table 6 shows the test results.

TABLE 6

| Type | | Wear width of flank face (mm) | Type | | Cutting time (min) |
|---|---|---|---|---|---|
| Present invention cutting tool | 1 | 0.22 | Comparative example cutting tool | 1 | *4.5 |
| | 2 | 0.26 | | 2 | *2.8 |
| | 3 | 0.18 | | 3 | *5.5 |
| | 4 | 0.35 | | 4 | *1.8 |
| | 5 | 0.27 | | 5 | *1.2 |
| | 6 | 0.19 | | 6 | *2.3 |
| | 7 | 0.23 | | 7 | *1.1 |
| | 8 | 0.29 | | 8 | *3.6 |
| | 9 | 0.26 | | 9 | *2.5 |
| | | | | 10 | *4.3 |

(Note)
*in comparative example cutting tools indicates a cutting time (min) until the end of a service life caused by the occurrence of chipping.

From the results shown in Table 6, the coated tool of the present invention includes the TiAlN layer as the hard coating layer, and in the TiAlN layer, the high Ti band-like region is present in a direction at an angle of 30 degrees or less with respect to the line normal to the surface of the cutting tool body. Accordingly, the toughness is improved. In addition, since there is no anisotropy in the layer in the layer thickness direction, the coated tool of the present invention exhibits excellent chipping resistance and wear resistance during intermittent cutting work of alloy steel or the like during which high-temperature heat is generated and high impact and intermittent loads are exerted on a cutting edge.

Contrary to this, it is obvious that the comparative example coated tools in which the high Ti band-like region is not formed in the TiAlN layer reaches the end of the service life within a relatively short period of time due to the occurrence of chipping.

INDUSTRIAL APPLICABILITY

The coated tool of the invention exhibits excellent wear resistance for a long-term usage as well as excellent chipping resistance in a case of being provided for intermittent cutting work of alloy steel or the like. Therefore, the coated cutting tool of the present invention can satisfactorily cope with the factory automation (FA) of cutting apparatuses, power saving and energy saving during cutting work, and a further reduction in costs.

The invention claimed is:

1. A surface-coated cutting tool comprising:
a cutting tool body; and
a hard coating layer that is provided on a surface of the cutting tool body made of any of WC cemented carbide, TiCN cermet, or a cubic boron nitride sintered material, wherein
the hard coating layer includes at least a complex nitride layer of Ti and Al with an average layer thickness of 0.5 to 10.0 μm,
in a case where a composition of the complex nitride layer of Ti and Al is expressed by a composition formula: $(Ti_xAl_{1-x})N$,
the complex nitride layer of Ti and Al has an average composition satisfying $0.10 \leq x \leq 0.35$ (here, x is in atomic ratio),
in the complex nitride layer of Ti and Al, a band-like region, in which a composition of a Ti component is relatively high compared to an average composition x of the Ti component, is present at least in a direction at an angle of 30 degrees or less with respect to a line normal to the surface of the cutting tool body,
an average width W of the band-like region, in which the composition of the Ti component is relatively high, is 30 to 500 nm, and
an average area ratio of the band-like region, in which the composition of the Ti component is relatively high, to a longitudinal section of the complex nitride layer of Ti and Al is 3 to 50 area %.

2. The surface-coated cutting tool according to claim 1, wherein, in a case where the average composition of the Ti component in the band-like region in which the composition of the Ti component is relatively high is referred to as X, the average composition x of the Ti component in the complex nitride layer of Ti and Al and the X satisfy a relationship of $(x+0.01) \leq X \leq (x+0.05)$.

3. The surface-coated cutting tool according to claim 1, wherein the complex nitride layer of Ti and Al has a mixed structure of crystal grains having a cubic structure and crystal grains having a hexagonal structure, and an average area ratio of the crystal grains having a cubic structure to a longitudinal section of the complex nitride layer of Ti and Al is 30 area % or more.

4. The surface-coated cutting tool according to claim 2, wherein the complex nitride layer of Ti and Al has a mixed structure of crystal grains having a cubic structure and crystal grains having a hexagonal structure, and an average area ratio of the crystal grains having a cubic structure to a longitudinal section of the complex nitride layer of Ti and Al is 30 area % or more.

\* \* \* \* \*